United States Patent [19]

Kobayashi et al.

[11] Patent Number: 5,481,496

[45] Date of Patent: Jan. 2, 1996

[54] SEMICONDUCTOR MEMORY DEVICE AND METHOD OF DATA TRANSFER THEREFOR

[75] Inventors: Toshifumi Kobayashi; Yoshikazu Morooka; Michihiro Yamada; Takeshi Hamamoto, all of Hyogo, Japan

[73] Assignee: Mitsubishi Denki Kabushiki Kaisha, Tokyo, Japan

[21] Appl. No.: 236,004

[22] Filed: May 2, 1994

Related U.S. Application Data

[63] Continuation of Ser. No. 799,728, Nov. 22, 1991, which is a continuation of Ser. No. 574,162, Aug. 29, 1990, which is a division of Ser. No. 353,564, May 18, 1989.

[30] Foreign Application Priority Data

Jun. 27, 1988 [JP] Japan ............................... 63-159806
Jun. 27, 1988 [JP] Japan ............................... 63-159807

[51] Int. Cl.$^6$ .................................. G11C 7/00; G11C 8/00
[52] U.S. Cl. .............. 365/189.05; 365/222; 365/230.03; 365/230.05; 365/230.09; 365/233; 365/239; 365/240
[58] Field of Search ......................... 365/189.05, 222, 365/230.03, 230.05, 230.09, 233, 239, 240

[56] References Cited

U.S. PATENT DOCUMENTS

| 4,498,155 | 5/1982 | Rao | 365/221 X |
| 4,757,477 | 7/1988 | Nagayama et al. | 365/230.05 |
| 4,825,411 | 4/1989 | Hamano | 365/230.05 |
| 4,839,868 | 6/1989 | Sato et al. | 365/230.09 |
| 4,855,959 | 8/1989 | Kobayashi | 365/230.05 |
| 4,891,795 | 1/1990 | Pinkham et al. | 365/230.05 |

FOREIGN PATENT DOCUMENTS 62-242252 4/1986 Japan.

OTHER PUBLICATIONS

K. Pinknam, "A High Speed Dual Port Memory with Simultaneous Serial and Random Mode Access for Video Applictions" IEEE Journal of Solid-State Circuit, vol. SC-19, No. 6 (Dec. 1984) pp. 999-1007.

K. Mashiko et al. "A CMOS Dual Port Memory With Serial Read/Write Function for Graphic Systems" IEEE Transactions on Consumer Electronics, vol. CE-32, No. 3 (Aug. 1986) pp. 636-643.

*Primary Examiner*—Michael A. Whitfield
*Attorney, Agent, or Firm*—Lowe, Price, LeBlanc & Becker

[57] ABSTRACT

Sense amplifiers provided for each of the bit line pairs are divided into groups to be independently driven, whereby the influence of sense amplifiers of different groups can be prevented, and therefore the destruction of data of the non-selected memory cells during data transfer can be prevented. In transferring data from the data register to the memory cell array, the sense amplifier is not activated until the stored information of the memory cells selected by the word line is fully read to the corresponding bit lines, whereby the destruction of data stored in the non-selected memory cells can be prevented.

8 Claims, 11 Drawing Sheets

5,481,496

SEMICONDUCTOR MEMORY DEVICE AND METHOD OF DATA TRANSFER THEREFOR

This application is a continuation of application Ser. No. 07/799,728 filed Nov. 22, 1991, which is a continuation of application Ser. No. 07/574,162, filed on Aug. 29, 1990, which is a divisional of application Ser. No. 07/353,564, filed on May 18, 1989.

BACKGROUND OF THE INVENTION

1. Field of the Invention

The present invention relates to a semiconductor memory device and a method of data transfer for the semiconductor memory device. More specifically, it relates to a 2 port memory device containing a random access memory (RAM) port and a serial access memory (SAM) port and to a method of data transfer therefor.

2. Description of the Background Art

Recently, 2 port memory devices for application to graphic display systems have been proposed. Such a 2 port memory device comprises two ports, namely, a RAM port which can be accessed at random and a SAM port which can be serially accessed. The details of such device is disclosed in "Nikkei Electronics" Aug. 12, 1985 (p.211 to 240). A conventional method of data transfer between the RAM port and the SAM port is disclosed in, for example, Japanese Patent Laying-Open Gazette Number 242252/1987. These examples of the prior art will be described in the following.

FIG. 1 is a block diagram showing a schematic structure of a conventional 2 port memory device. Referring to the figure, the 2 port memory device comprises a RAM (Random Access Memory) 1, a SAM (Serial Access Memory) 2, a transfer portion 3 and a control circuit 4. The RAM 1 comprises a memory cell array 11, a row decoder 12, an I/O switch 13 and a column decoder 14. In the memory cell array 11, a plurality of word lines WL and a plurality of sets of bit line pairs BL and $\overline{BL}$ are arranged intersecting with each other, with memory cells MC provided at respective intersections. The row decoder 12 selects one word line out of the plurality of word lines WL based on an inputted row address. The I/O switch 13 is provided for respective bit lines BL and $\overline{BL}$ and is commonly connected to an I/O line 15. The column decoder 14 selects a desired bit line pair BL and $\overline{BL}$ by selectively opening/closing the I/O switch 13 based on an inputted column address. As is well known, in such a RAM 1, the writing and reading of data to and from an arbitrary memory cell MC can be carried out at random.

The transfer portion 3 is provided between the RAM 1 and the SAM 2 to transfer data between the RAM 1 and the SAM 2. The transfer portion 3 comprises precharging circuits 31, sense amplifiers 32 and transfer gates 33 each of which is provided for each bit line pair BL, $\overline{BL}$. Each precharging circuit 31 precharges the corresponding bit line pair BL, $\overline{BL}$ in accordance with a precharging signal PR applied from a timing control circuit (not shown). Each sense amplifier 32 amplifies a small potential difference between the corresponding bit line pair BL, $\overline{BL}$ which appears in data reading or writing. These sense amplifiers 32 are activated by activating signals transmitted on a sense amplifier activating signal line pair SD, $\overline{SD}$ extending from the control circuit 4. Each transfer gate 33 controls opening/closing between the SAM 2 and the corresponding bit line pair BL, $\overline{BL}$ in response to a transfer signal TG applied thereto.

The SAM 2 comprises data registers 21 and a serial selector 22. A separate register 21 is provided for every bit line pair BL, $\overline{BL}$ to store data of one row of the memory cell array 11. The serial selector 22 reads the data held in the data register 21 to output the same serially to an input/output line 23 and writes serial data inputted through the input/output line 23 into the data register 21.

In the following, circuit structures of the transfer portion 3 and of the peripheral circuits in FIG. 1 will be described in detail with reference to FIG. 2. A memory cell $MC_0$ is constituted by an N channel type MOS transistor (hereinafter referred as an NMOS transistor) NQ1 and a capacitor C and is selected by setting the corresponding word line WL at an H level. A precharging circuit $31_0$ is constituted by NMOS transistors NQ2 and NQ3 connected in series between the bit lines $BL_0$ and $\overline{BL_{0+}}$. A precharging signal PR is applied to the gate of each of the NMOS transistors NQ2 and NQ3 from a timing control circuit, not shown. The precharging circuit $31_0$ turns on when the precharging signal PR is at the H level, and it applies a precharging voltage Vcc/2 to the bit line pair $BL_0$, $\overline{BL_0}$. Consequently, the bit line pair $BL_0$, $\overline{BL_0}$ is precharged. A sense amplifiers $32_0$ comprises a pair of NMOS transistors NQ4 and NQ5 and a pair of P channel type MOS transistors (hereinafter referred to as PMOS transistors) PQ1 and PQ2, respectively cross coupled with each other. The sense amplifiers 320 amplifies a small potential difference between the bit line pair $BL_0$ and $\overline{BL_0}$ as a pair of sense amplifier activating signal lines SD and $\overline{SD}$ from the control circuit 4 are set at the H level and L level, respectively. A transfer gate $33_0$ is constituted by two NMOS transistors NQ6 and NQ7 respectively connected between the bit line pair $BL_0$, $\overline{BL_0}$ and a storage node pair $DR_0$ and $\overline{DR_0}$ $21_0$. These NMOS transistors NQ6 and NQ7 turn on when the transfer signal TG is at the H level to connect the bit line pair $BL_0$, $\overline{BL_0}$ to the storage node pair $DR_0$, $\overline{DR_0}$. The data register $21_0$ is constituted by two inverters IV1 and IV2 which are connected in parallel in opposite directions between the bit line pair $BL_0$ and $\overline{BL_0}$.

The memory cell $MC_1$, the precharging circuit $31_1$, the sense amplifiers $32_1$, the transfer gate $33_1$ and the data register $21_1$ have the same structure as the memory cell $MC_0$, the precharging circuit $31_0$, the precharging circuit $31_0$, the sense amplifier $32_0$, the transfer gate $33_0$ and the data register $21_0$, respectively. Although two sets of memory cells, precharging circuits, sense amplifiers, transfer gates and the data registers are shown in FIG. 2 for the purpose of simplicity, there are a number of sets of these components as shown in FIG. 1, each of which has the same circuit structure as described above.

The control circuit 4 comprises two NMOS transistors NQ8 and NQ9 interposed in series between a pair of sense amplifier activating signal lines SD and $\overline{SD}$, a PMOS transistor PQ3 interposed between the sense amplifier activating signal line SD and the power supply Vcc and an NMOS transistor NQ10 interposed between the sense amplifier activating signal line $\overline{SD}$ and the ground. A precharging signal PR is applied from a timing control circuit, not shown, to the base of each of the transistors NQ8 and NQ9. These NMOS transistors NQ8 and NQ9 turn on when the precharging signal PR is at the high level to apply a precharging voltage Vcc/2 to the pair of sense amplifier activating signal lines SD and $\overline{SD}$. Consequently, the sense amplifier activating signal lines SD and $\overline{SD}$ are precharged. Sense amplifier enabling signals $\overline{SAE}$ and SAE are applied to the base of the PMOS transistor PQ3 and of the NMOS transistor NQ10 from a timing control circuit, not shown, respectively. The PMOS transistor PQ3 and the NMOS transistor NQ10 turn on when the sense amplifier enabling signals $\overline{SAE}$ and SAE are at the L level and H level, respectively, thereby driving the sense amplifier activating signal line SD to the H level and the sense amplifier activating signal line SD to the L level.

In the above described structure, the RAM 1 and the SAM 2 operate non-synchronously. The data of one row (one word line) stored in the memory cell array 11 are collectively transferred to the data register 21 of the SAM 2 by the transfer portion 3, and they are serially outputted through the input/output line 23 by means of the serial selector 22. The data inputted from the serial selector 22 are stored in the data register 21 and they are collectively transferred to the RAM 1 by the transfer portion 3 to be written in the memory cell array 11.

How the data is transferred from the RAM 1 to the SAM 2, for example from the memory cell $MC_0$ to the data register $21_0$ will be described in the following with reference to the diagram of waveforms of FIG. 3. Prior to the data transfer, the precharging signal PR is at the H level, and the bit line pair $BL_0$, $\overline{BL_0}$ and the sense amplifier activating signal line pair SD, $\overline{SD}$ are all precharged to Vcc/2. When the precharging signal PR is set at the L level at the time $T_0$, the bit line pair $BL_0$, $\overline{BL_0}$ and the sense amplifier activating signal line pair SD, $\overline{SD}$ are brought to a high impedance state while being maintained at the level of Vcc/2. Thereafter, when the word line WL is brought to the H level at the time $T_1$, the charges stored in the capacitor C in the memory cell $MC_0$ are read to the bit line $BL_0$. Now, if the H level has been stored in the capacitor of the memory cell $MC_0$, the potential on the bit line $BL_0$ rises a little. After the time period of $\Delta t_1$ long enough to enable full reading of the charges, that is, at the time $t_2$, the sense amplifier enabling signals SAE and $\overline{SAE}$ are respectively set at the H level and the L level, whereby the sense amplifiers $32_0$ start amplification of the potential difference between the bit line pair $BL_0$ and $\overline{BL_0}$. After the time period of $\Delta t_2$ long enough to permit full amplification, namely, at the time $t_3$, the transfer signal TG is brought to the H level. Since the driving capability of the inverters IV1 and IV2 constituting the data register $21_0$ is set smaller than the driving capability of each of the transistors constituting the sense amplifiers $32_0$, the data stored in the data register $21_0$ is rewritten by the sense amplifier $32_0$ through the transfer gate $33_0$. The data stored in the memory cell $MC_0$ are transferred to the data register $21_0$ through the above described operation.

How the data is transferred from the SAM 2 to the RAM 1, for example from the data register $21_0$ to the memory cell $MC_0$ will be described in the following with reference to the diagram of waveforms of FIG. 4. Prior to the data transfer, the precharging signal PR is set at the H level to precharge respective nodes. When the precharging signal PR is brought to the L level at the time $t_0$ and thereafter the transfer signal TG is brought to the H level, the potentials on the bit line pair $BL_0$ and $\overline{BL_0}$ gradually change in accordance with the data stored in the data register $21_0$. For example, if the storage node $\overline{DR_0}$ has been at the H level and the storage node $DR_0$ has been at the L level, the bit line $\overline{BL_0}$ changes to the H level while the bit line $BL_0$ changes to the L level. Thereafter, when the word line WL is brought to the H level at the time $t_1$, the charges, namely, the information, stored in the capacitor of the memory cell $MC_0$ are read on the bit line $BL_0$. However, the information is offset by the driving capability of the data register $21_0$. After the potential difference between the bit line pair $BL_0$, $\overline{BL_0}$ becomes large, the sense amplifier is activated at the time $t_2$ to set the bit line $BL_0$ at the L level and the bit line $\overline{BL_0}$ at the H level. On this occasion, the word line WL is at the H level, so that the data on the bit line $BL_0$ are written in the memory cell $MC_0$.

Although the sets of the memory cells and the data registers represented by reference characters with the suffix of 0 are employed in the foregoing, the data transfer is carried out in the same manner also in other sets.

Now, in a graphic display system, not all of the data but only a portion thereof is often transferred. FIGS. 5 and 6 show an example of a 2 port memory device enabling such partial transfer. The transfer gate $33_0$ is adapted to be controlled by a transfer signal $TG_0$ while the transfer gate $33_1$ is adapted to be controlled by another transfer signal $TG_1$. Partial transfer is carried out by setting only the transfer signal corresponding to the data register whose data is to be transferred at the H level. However, in the structure such as shown in FIGS. 5 and 6, the conventional method of transfer presents the following problems in data transfer from the data register 21 to the memory cell MC. The problem will be described in the following with reference to the diagram of waveforms of FIG. 7.

After the precharging signal PR is set at the L level at the time t0, the transfer signal $TG_0$ becomes H level, and the transfer signal $TG_1$ is maintained at the L level. At that time, the voltages on the bit line pair $BL_0$, $\overline{BL_0}$ start changing in accordance with the data stored in the data register $21_0$. For example, assuming that the storage node $DR_0$ is at the H level and the storage node $\overline{DR_0}$ is at the L level, the potential on the bit line $BL_0$ rises from Vcc/2 while the potential on the bit line $\overline{BL_0}$ lowers from Vcc/2. When the potential of the bit line $BL_0$ becomes higher than the threshold voltage of the NMOS transistor NQ5 constituting the sense amplifier $32_0$, the NMOS transistor NQ5 is brought to the on state. In the similar manner, when the potential of the bit line $\overline{BL_0}$ becomes lower than the threshold voltage of the PMOS transistor PQ1 constituting the sense amplifier $32_0$, the PMOS transistor PQ1 is brought to the on state. Consequently, the sense amplifier activating signal line SD is connected to the bit line $BL_0$ and the sense amplifier activating signal line $\overline{SD}$ is connected to the bit line $\overline{BL_0}$. On this occasion, since the sense amplifier activating signal lines SD and $\overline{SD}$ are both at the high impedance state, the potential on the sense amplifier activating signal line SD gradually rises drawn by the bit line $BL_0$ while the potential on the sense amplifier activating signal line $\overline{SD}$ gradually lowers drawn by the bit line $\overline{BL_0}$. When the potential on each of the sense amplifier activating signal lines SD and $\overline{SD}$ changes by an amount larger than the threshold voltage of the transistors constituting the sense amplifier $32_1$ from Vcc/2, the sense amplifier $32_1$ starts amplifying operation. However, at that time, the word line WL is not yet brought to the H level or, even when it is at the H level, the data of the memory cell $MC_1$ are not yet fully read to the bit line pair $BL_1$ and $\overline{BL_1}$, so that the sense amplifier 32 amplifies the data corresponding to the imbalance of itself.

Since the data transfer is carried out in the above described manner in the conventional 2-port memory device, when partial data transfer from the data register to the memory cell is carried out, the data stored in the memory cell which is not selected for the transfer may possibly be damaged (the data may possibly be inverted to an erroneous data).

SUMMARY OF THE INVENTION

The present invention was made to solve the above described problem and its object is to prevent damage to the data stored in a non selected memory cell when partial data transfer is carried out between a memory cell and a data register.

Briefly stated, in the present invention, a plurality of sense amplifier driving means are provided, one for every group of bit line pairs, each sense amplifier driving means being commonly connected to sense amplifiers of the corresponding group and separated from sense amplifier of other groups. Consequently, the sense amplifier activating signal line pair extending from each sense amplifier driving means are separated between the group of sense amplifier executing the data transfer and the group of sense amplifiers in which the data transfer is intercepted, whereby they are driven independent from each other. Consequently, the destruction of stored information of the non-selected memory cell can be prevented when partial data transfer is carried out from the data register to the memory cell.

In accordance with another aspect of the present invention, in data transfer from the data register to the memory cell, the memory cell is selected by the word line after the bit line is precharged, the data of the selected memory cell is fully read to the bit line, then the data register and the bit line pair are selectively connected by gate means, and thereafter the sense amplifier is activated. Consequently, the amplifying operation of the sense amplifier is not started until the data of the memory cell is fully read on the bit line on which the data transfer from the data register to the memory cell is intercepted. Therefore, the destruction of the data stored in the said memory cell can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
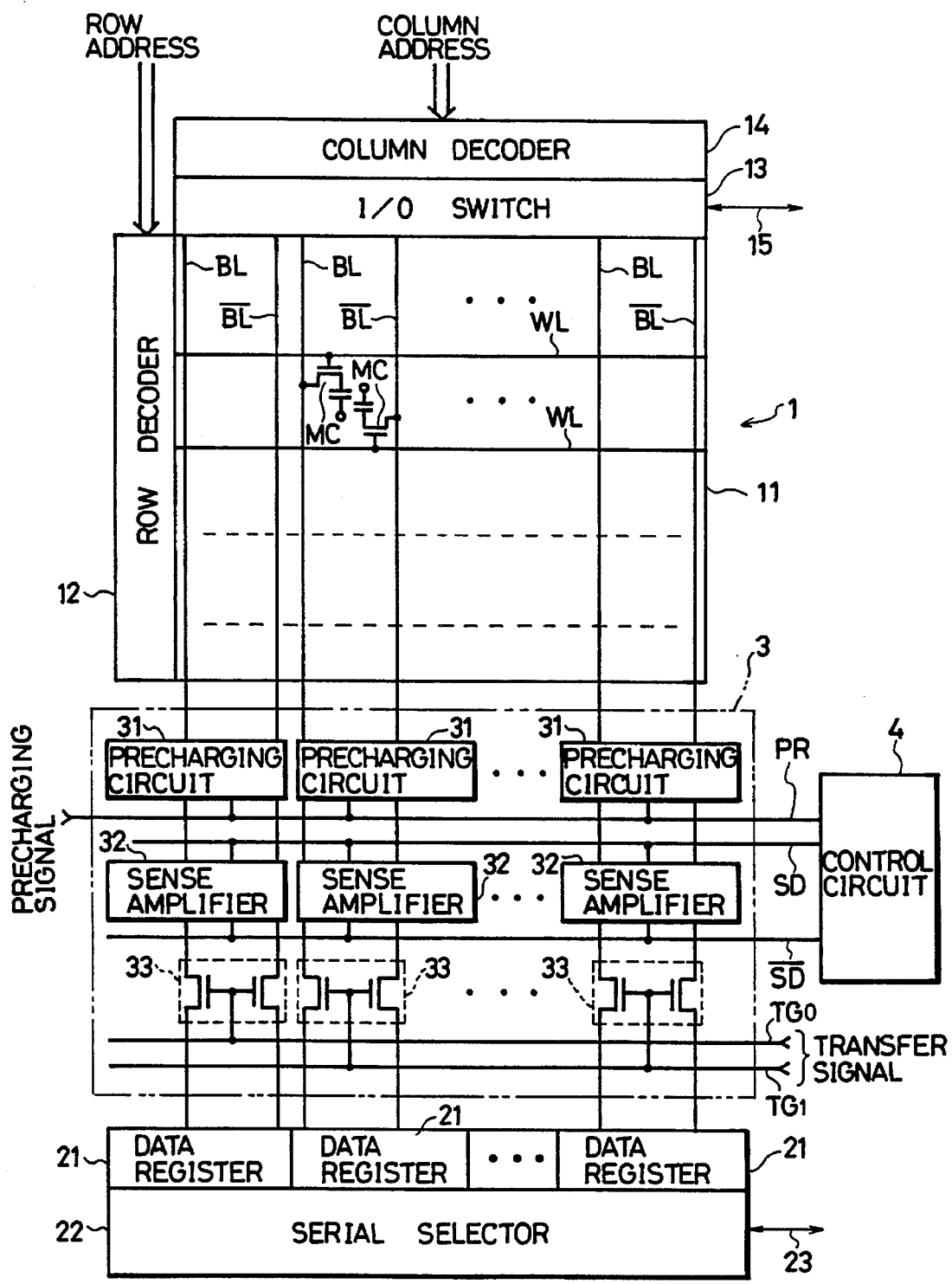
FIG. 5 is a block diagram showing a schematic structure of a conventional 2 port memory device capable of partial data transfer.
Figure 6:
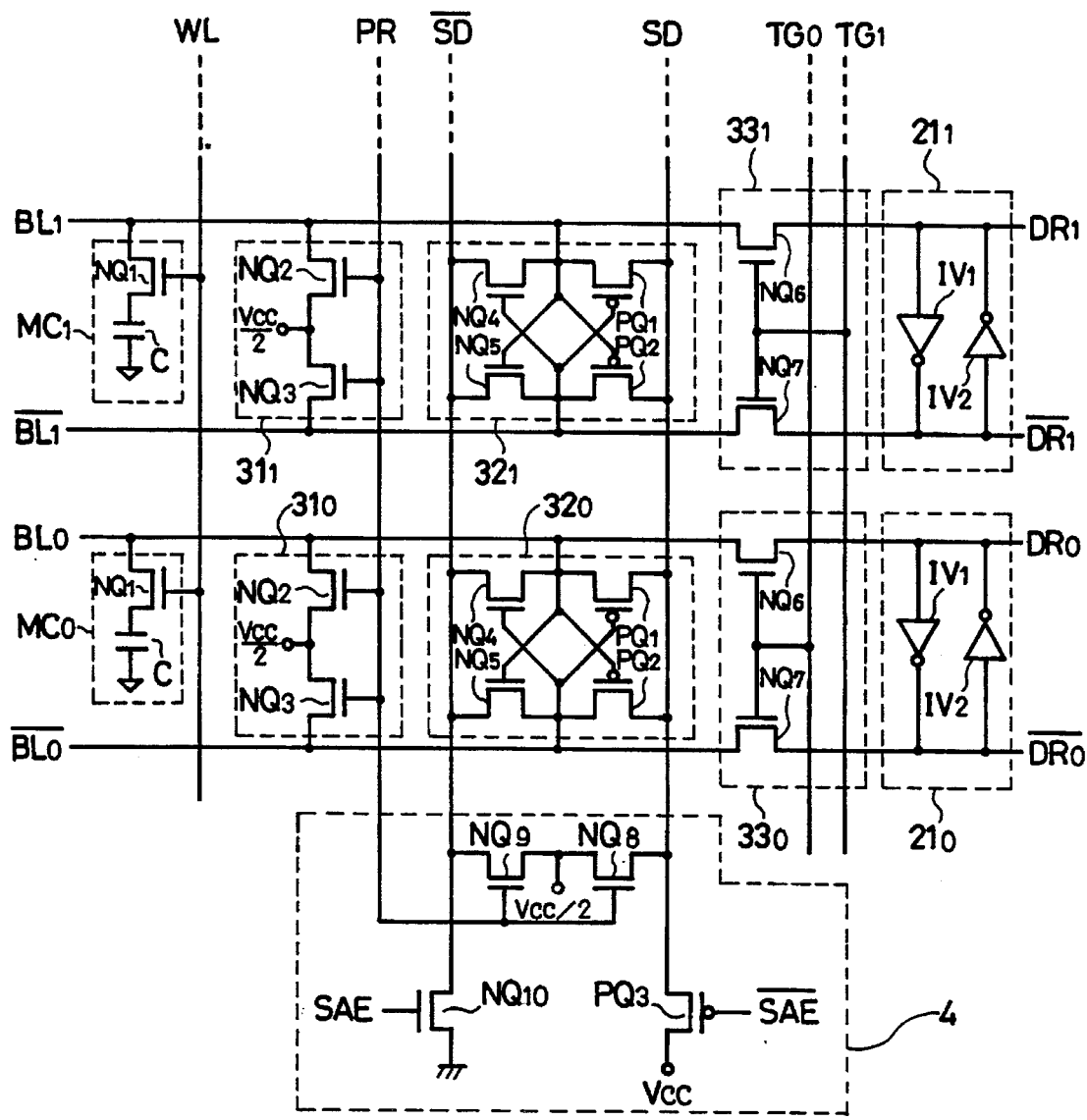
FIG. 6 is a circuit diagram showing in more detail the data transfer portion and the peripheral circuits thereof in the conventional device shown in FIG. 5.
Figure 8:
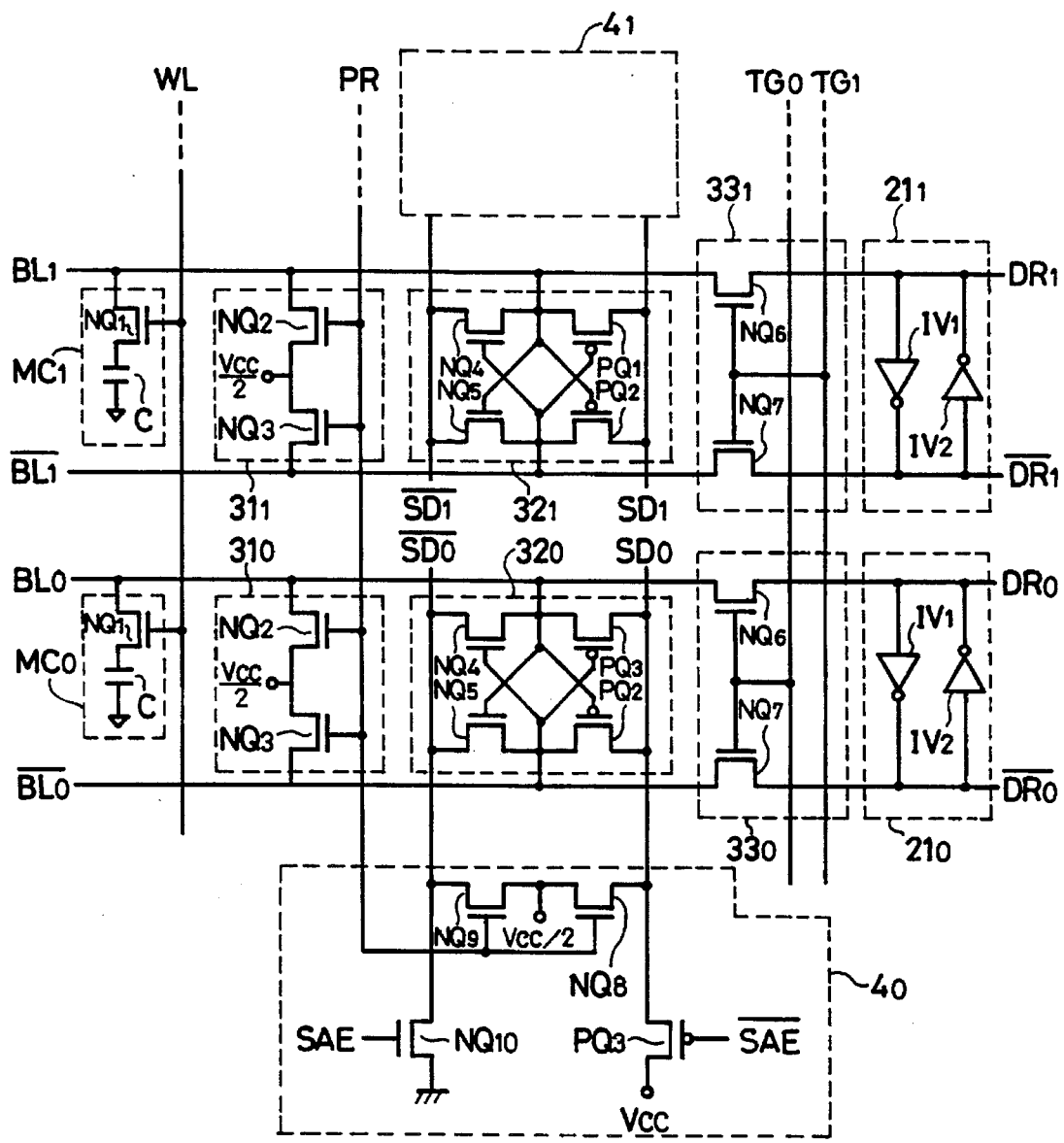
FIG. 8 is a schematic diagram showing a partial structure of a semiconductor memory device in accordance with one embodiment of the present invention.

In the following, one embodiment of the present invention will be described with reference to FIG. 8. In this embodiment, it is assumed that each of the transfer gates $33_0$ and $33_1$ is controlled by one of the transfer signals $TG_0$ and $TG_1$. Although only one set of transfer gates are controlled by the transfer signal $TG_0$ and only one set of transfer gates are controlled by the signal TG1 in FIG. 8, this is only for simplicity of drawing and a plurality of sets of transfer gates are actually employed. Therefore, the transfer gates and the bit line pairs belonging thereto are divided into a first group which is controlled by the transfer signal $TG_0$ and a second group which is controlled by the transfer signal $TG_1$. Corresponding to the two groups, two sets of control circuits are provided. One control circuit $4_0$ is provided corresponding to the sense amplifier (sense amplifier $32_0$ in FIG. 8) belonging to the first group, and the other control circuit $4_1$ is provided corresponding to the sense amplifier (sense amplifier $32_1$ of FIG. 8) of the second group. The control circuit $4_0$ is connected to the sense amplifier $32_0$ belonging to the first group by sense amplifier activating signal line pair $SD_0$ and $\overline{SD_0}$. The control circuit $4_1$ is connected to the sense amplifier $32_1$ belonging to the second group by the sense amplifier activating signal line pair $SD_1$ and $\overline{SD_1}$. What is important is that the sense amplifier activating signal line pair is divided between each of the groups. Namely, in FIG. 8, the sense amplifier activating signal line pair $SD_0$ and $\overline{SD_0}$ is electrically isolated from the signal line pair $SD_1$ and $\overline{SD_1}$. Therefore, the influence between sense amplifiers of respective groups can be prevented, and therefore malfunctions of the same can be prevented. Other structure is the same as the conventional device shown in FIGS. 5 and 6, and the corresponding portions are represented by the same reference numerals.

Figure 7:
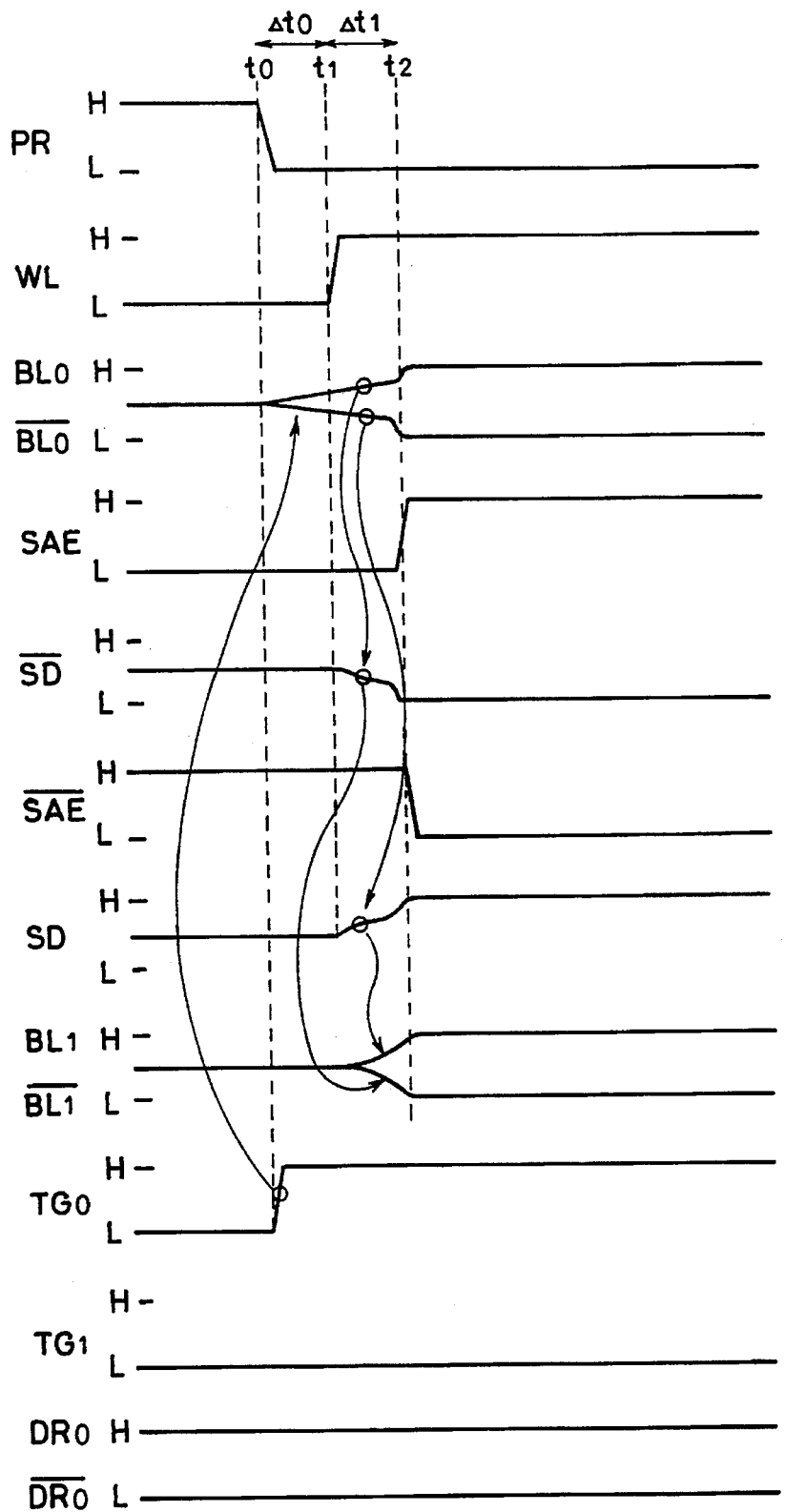
FIG. 7 is a diagram of waveforms for illustrating an operation of data transfer from the data register to the memory cell in the conventional device shown in FIGS. 5 and 6.
Figure 9:
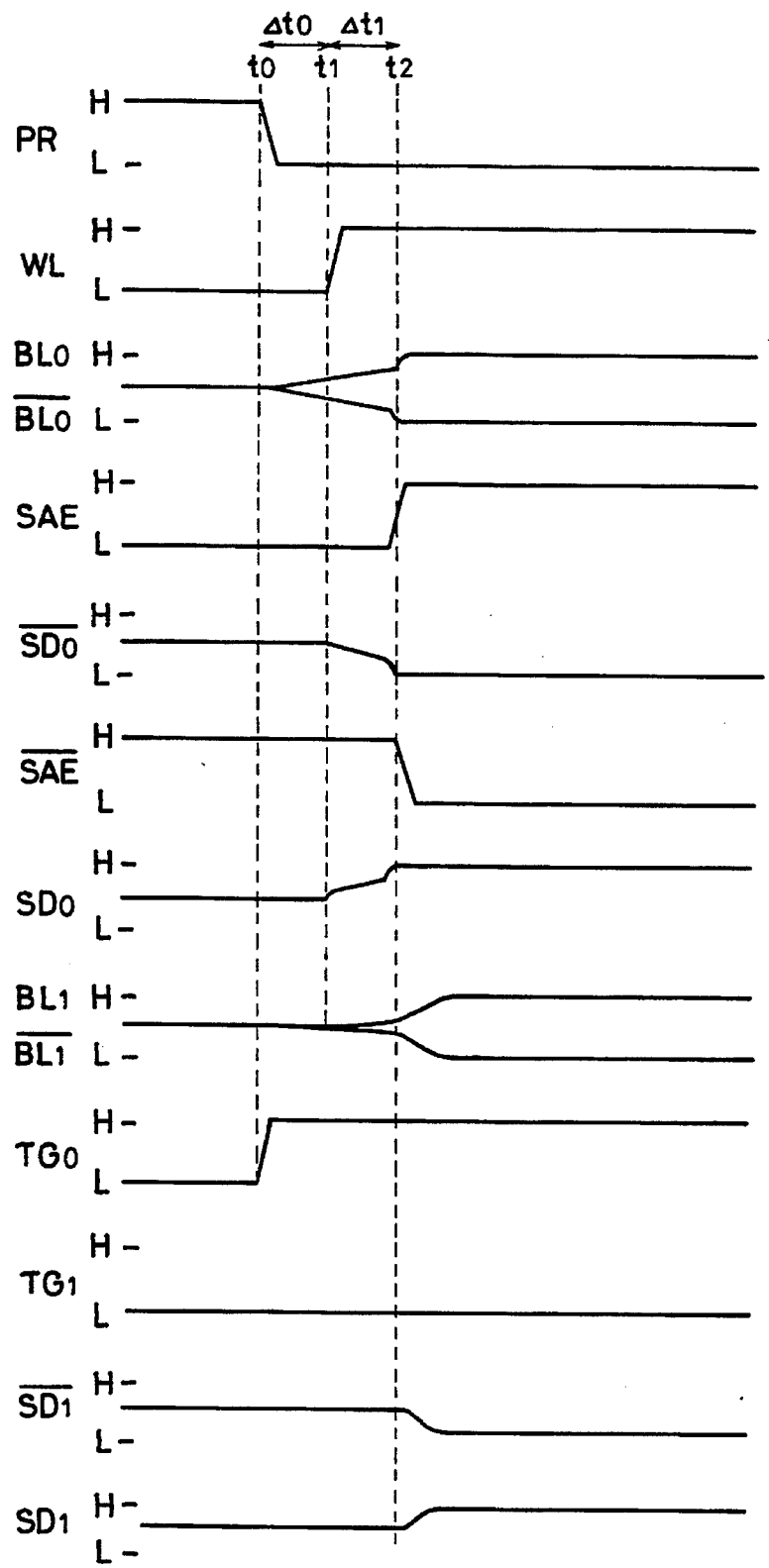
FIG. 9 is a diagram of waveforms for illustrating the operation of the embodiment shown in FIG. 8.

The operation of the embodiment shown in FIG. 8 will be described in the following with reference to the diagram of waveforms of FIG. 9. First, at the time $t_0$, the precharging signal PR is set at the L level, and thereafter the transfer signal $TG_0$ is set at the H level and the transfer signal $TG_1$ is kept at the L level. Then, as is described with reference to the prior art of FIG. 7, the potential difference between the bit line pair $BL_0$ and $\overline{BL_0}$ becomes large in accordance with the data in the data register $21_0$. Accordingly, the pair of sense amplifier activating signal lines $SD_0$ and $\overline{SD_0}$ begin to change to the L level and to the H level, respectively. However, since the pair of sense amplifier activating signal lines SD1 and $\overline{SD1}$ are separated from the sense amplifier activating signal lines $SD_0$ and $\overline{SD_0}$, the pair of sense amplifier activating signal lines SD1 and $\overline{SD1}$ are maintained in a precharged state of Vcc/2. Similarly, the bit line pair BL1 and $\overline{BL1}$ is also kept at the precharged state of Vcc/2. Thereafter, when the word line WL becomes H level at the time $t_1$, the data stored in the memory cells $MC_0$ and $MC_1$ are read on the bit lines $BL_0$ and $BL_1$, respectively. On this occasion, since the bit line $BL_0$ is driven by the data register $21_0$ through the transfer gate $33_0$, the data read from the memory cell $MC_0$ are cancelled. Meanwhile, since the bit line $BL_1$ is at the high impedance state, the potential thereof changes in accordance with the data read from the memory cell $MC_1$. After the time period $\Delta t_1$ long enough to permit full reading, the sense amplifier enabling signals SAE and $\overline{SAE}$ are set at the H level and L level, respectively, at the time t2, then the sense amplifier activating signal lines $\overline{SD_0}$ and $\overline{SD_1}$ are driven to the L level, and the sense amplifier activating signal lines $SD_0$ and $SD_1$ are driven to the H level.

Consequently, the sense amplifier $32_0$ amplifies the data in the data register $21_0$ and the sense amplifier $32_1$ amplifies the data in the memory cell $MC_1$, which data are rewritten in the memory cells $MC_0$ and $MC_1$, respectively.

Although the transfer gates are controlled by one or the other one of two transfer signals in the foregoing, the number of transfer signals may be three or more. In that case, the number of control circuits and the number of sense amplifier activating signal line pairs may be increased corresponding to the number of transfer signals. However, the sense amplifier activating signal line pair extending from one control circuit must be electrically separated from any other sense amplifier activating signal line pairs extending from other control circuits.

As described above, in the above embodiment, control circuits are provided one for every group of bit line pairs, each control circuit driving only the sense amplifiers of the corresponding group, and the sense amplifiers are electrically separated from the sense amplifiers of other groups. Therefore, in partial data transfer from the data register to the memory cell, the sense amplifiers of respective groups do not influence with each other between groups. Consequently, the destruction of data stored in the non-selected memory cell can be prevented.

Figure 10:
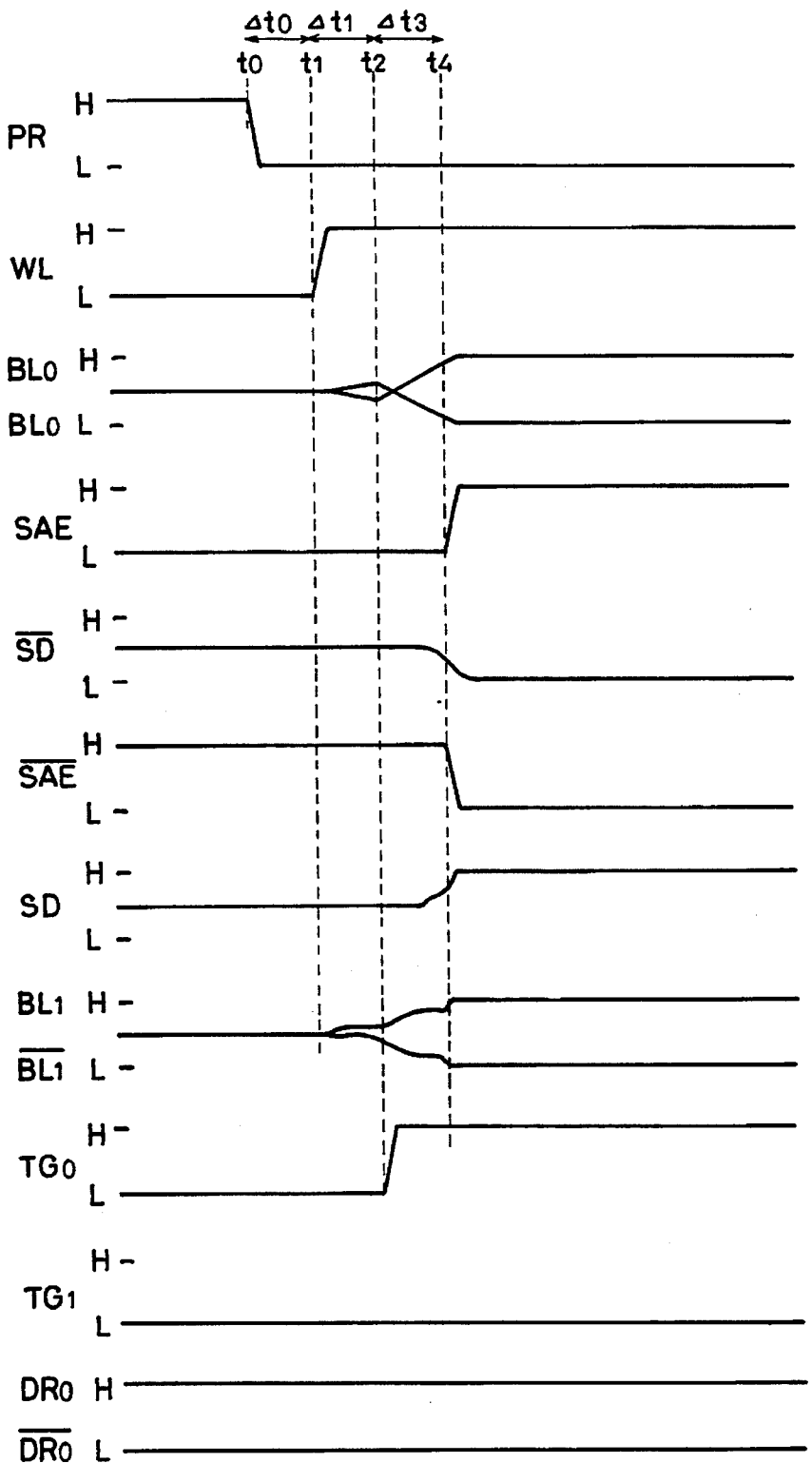
FIG. 10 is a diagram of a waveforms illustrating the method of data transfer in accordance with another embodiment of the present invention.

Another embodiment of the present invention will be described in the following with reference to the diagram of waveforms of FIG. 10. FIG. 10 shows an improvement of the method of data transfer in the 2 port memory device shown in FIGS. 5 and 6. Therefore, the structure of the 2 port memory device is the same as that shown in FIGS. 5 and 6. In FIG. 10, only the operation of partial data transfer from the data register to the memory cell, which was the problem, is shown.

First, by setting the precharging signal PR at the L level at the time $t_0$ and by setting the word line WL at the H level at the time $t_1$, the data stored in the memory cells $MC_0$ and $MC_1$ are read on the bit lines $BL_0$ and $BL_1$, respectively. After the time period of $\Delta t_1$ long enough to permit full reading, the transfer signal $TG_0$ is set at the H level to connect the data register $21_0$ to the bit line pair $BL_0$, $\overline{BL_0}$. Now it is assumed that the transfer signal $TG_1$ is maintained at the L level, and the data transfer from the data register $21_0$ is intercepted. When the transfer signal $TG_0$ becomes H level at the time $t_2$, the data which have been read to the bit line $BL_0$ are cancelled by the driving capability of the data register $21_0$, and the potentials on the bit line pair $BL_0$ and $\overline{BL_0}$ begin to change in accordance with the data stored in the data register $21_0$. When the potential difference between the bit line pair $BL_0$ and $\overline{BL_0}$ becomes larger than a prescribed level, the sense amplifier $32_1$ starts amplifying operation through the sense amplifier activating signal line pair SD and $\overline{SD}$, as described with reference to the prior art of FIG. 7. However, since the data of the memory cell MC1 have been fully read to the bit line $BL_1$ at that time, the sense amplifier $32_1$ amplifies the read data. Therefore, after an appropriate time period $\Delta t_3$ (in which the memory cell data on the bit line $BL_0$ are cancelled and the data of the data register $21_0$ are fully read to the bit line pair $BL_0$ and $\overline{BL_0}$) from the time $t_2$, that is, at the time $t_4$, by setting the sense amplifier enabling signals SAE and $\overline{SAE}$ at the H level and L level respectively, the sense amplifier $32_0$ amplifies the data of the data register $21_0$ and the sense amplifier $32_1$ amplifies the data of the memory cell $MC_1$. Therefore, the data transfer from the data register to the memory cell can be completed without damaging the data of the non-selected memory cell.

Figure 1:
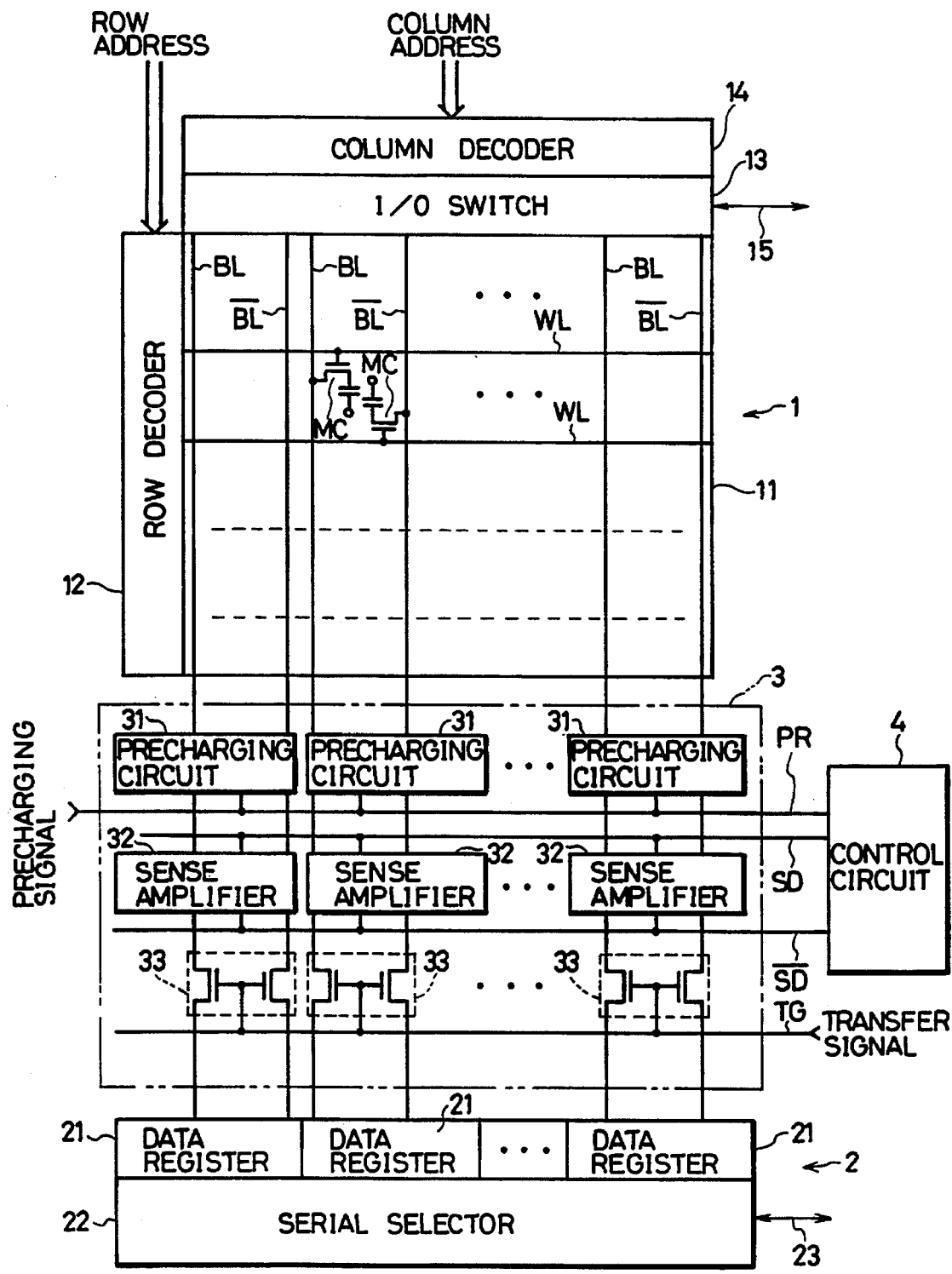
FIG. 1 is a block diagram showing a schematic structure of a conventional 2 port memory device.
Figure 2:
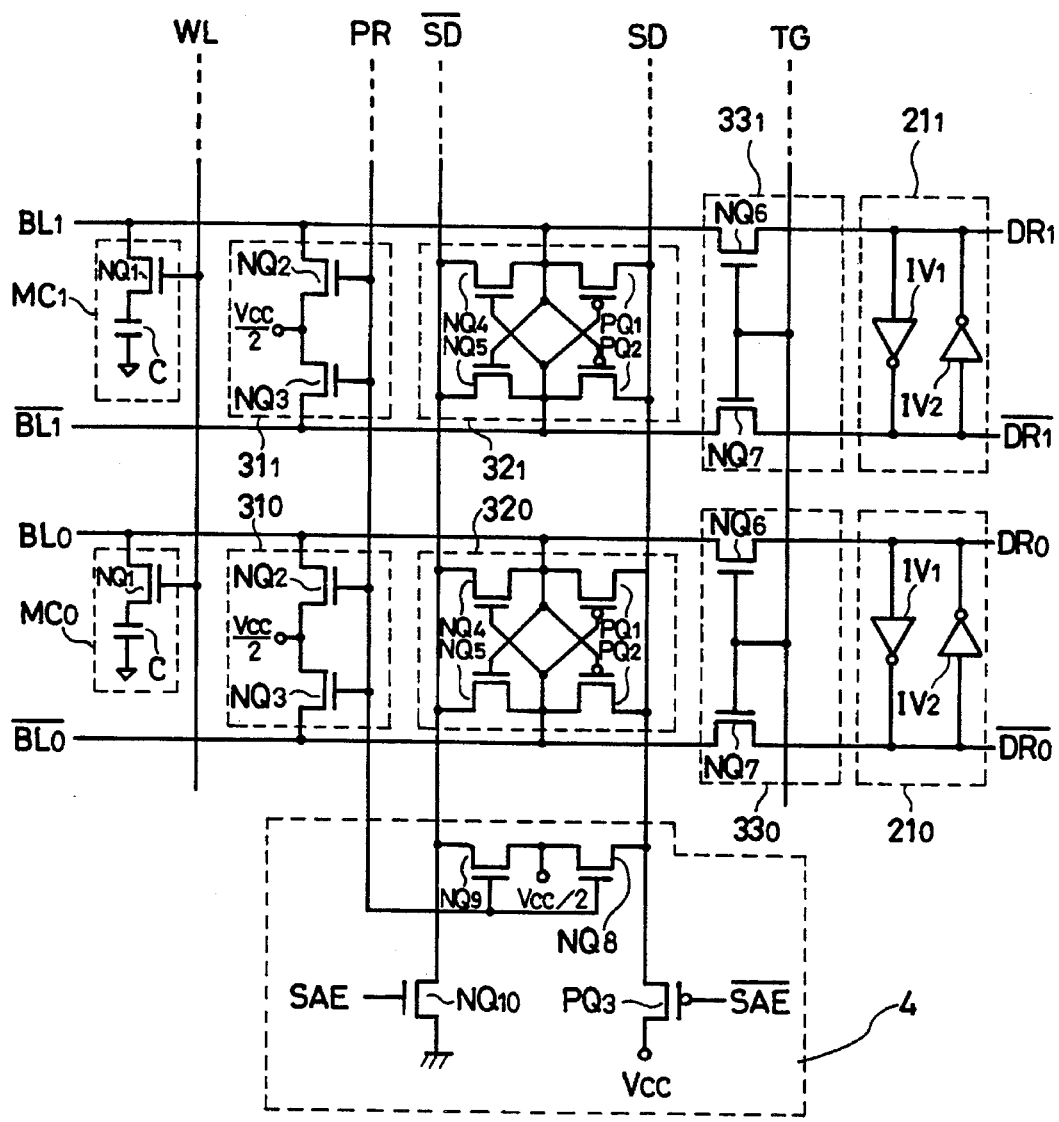
FIG. 2 is a circuit diagram showing in more detail the transfer portion 3 and the peripheral circuits thereof of the 2 port memory device shown in FIG. 1.
Figure 3:
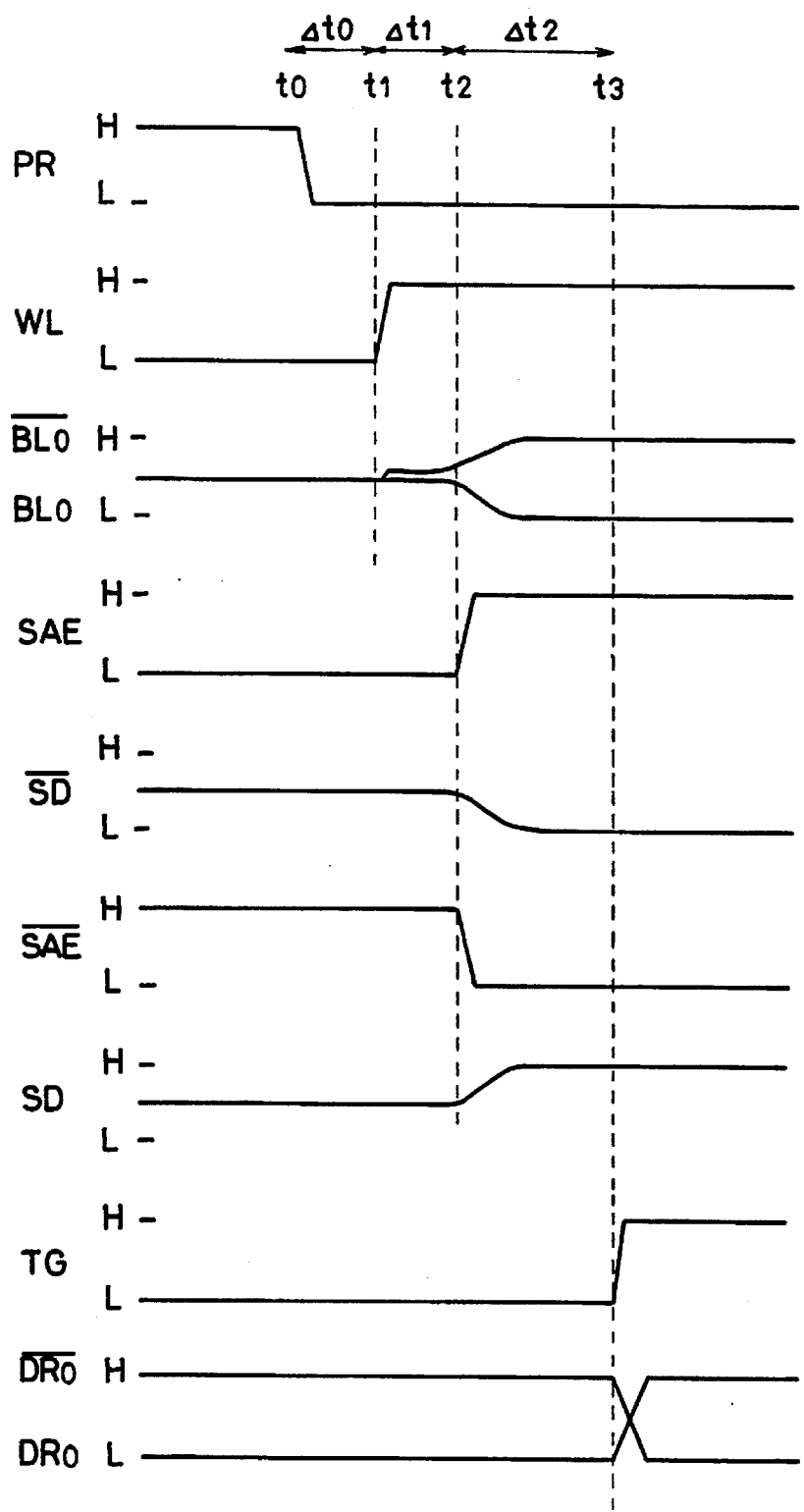
FIGS. 3 and 4 are diagrams of waveforms for illustrating the operation of the conventional device shown in FIG. 1.
Figure 4:
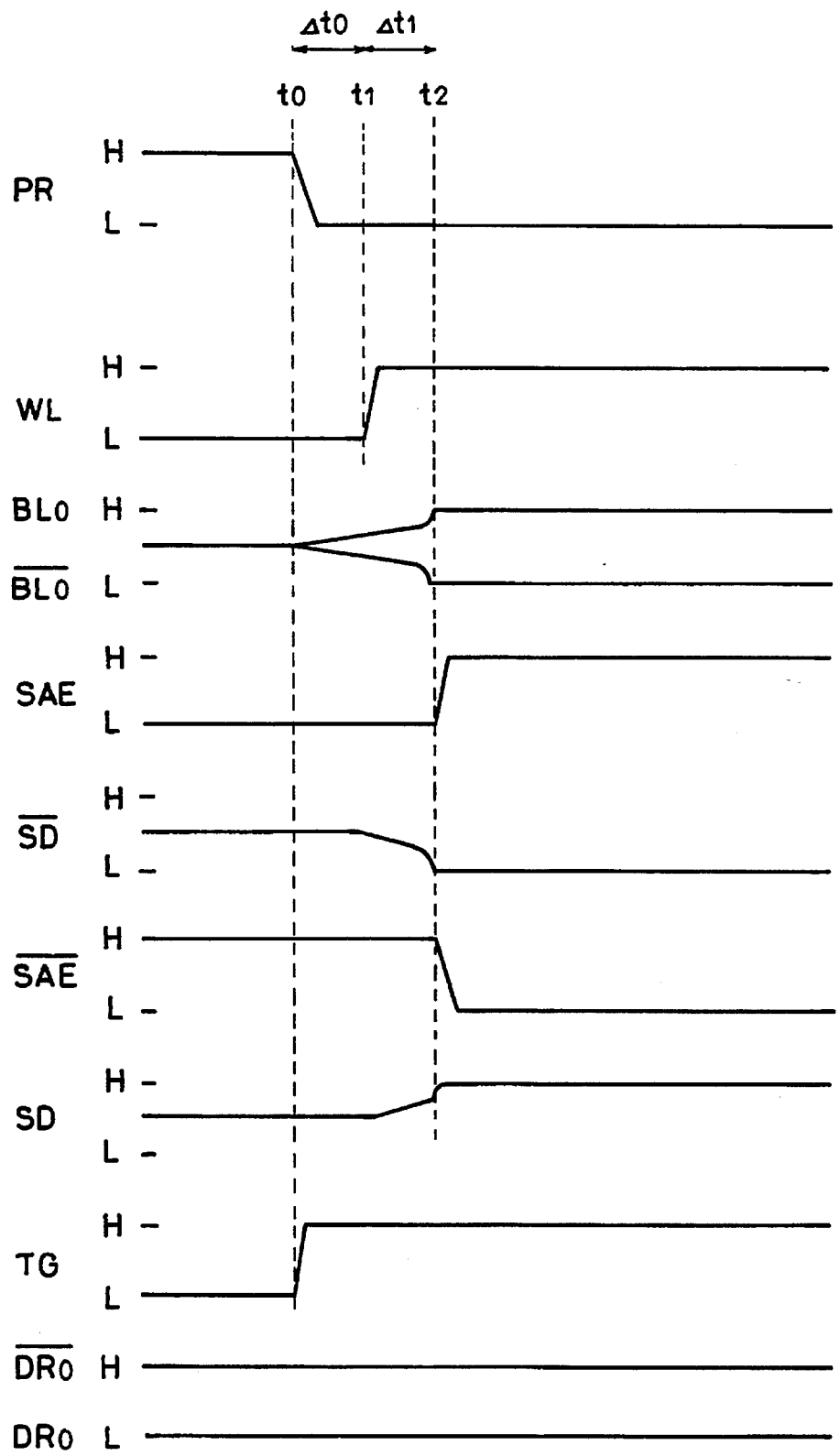
Figure 11:
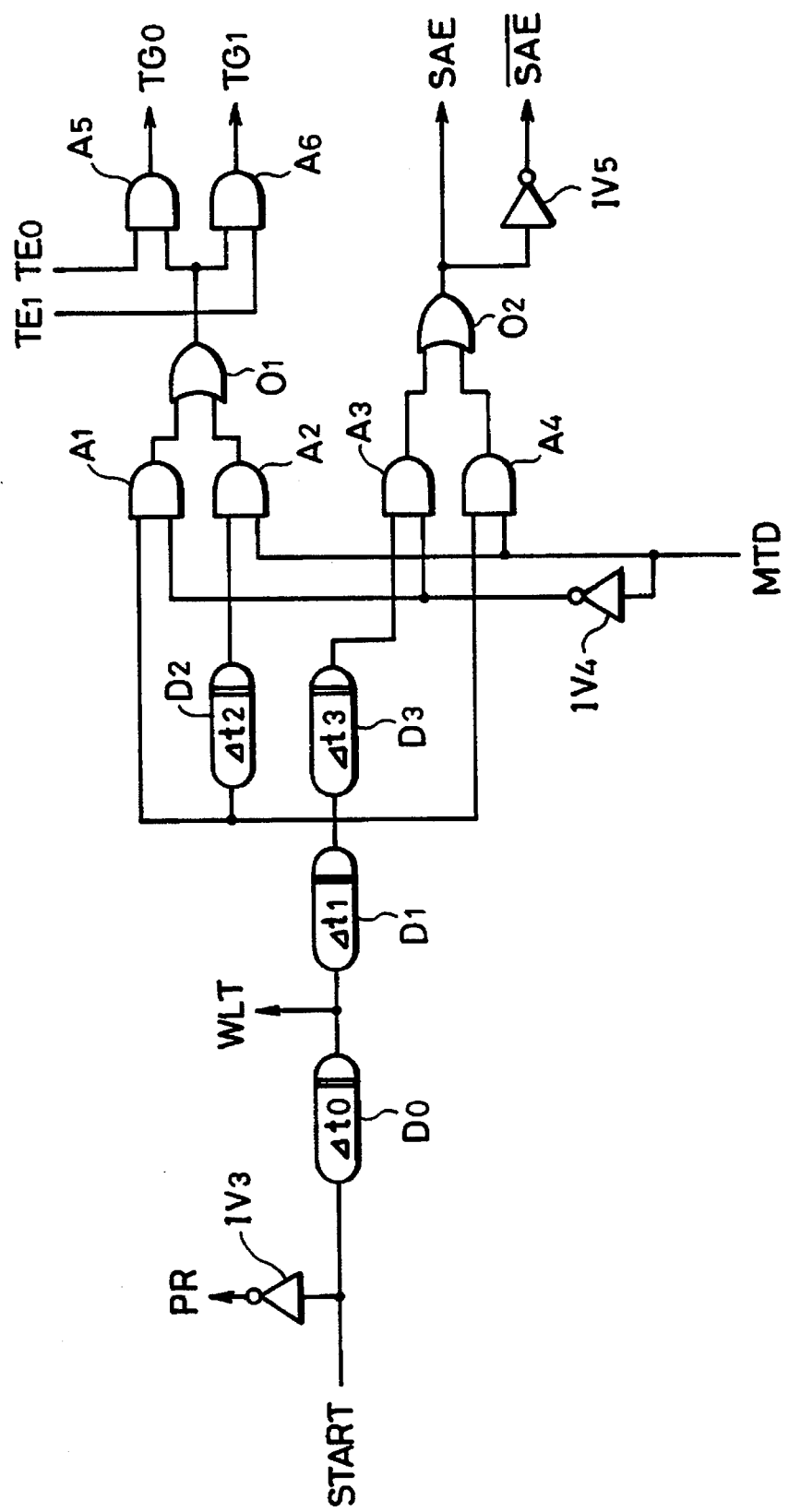
FIG. 11 is a schematic diagram showing an example of a structure of a timing control circuit for realizing the method of data transfer shown in FIG. 10.

FIG. 11 is a schematic diagram showing an example of a structure of the timing control circuit for realizing the method of data transfer in accordance with the embodiment shown in FIG. 10. Referring to the figure, the timing control circuit comprises inverters IV3 to IV5, delay circuits D0 to D3, AND gates A1 to A6, and OR gates 01 and 02. The delay circuits D0 to D3 have the delay time of $\Delta t_0$ to $\Delta t_3$, respectively. The delay times $\Delta t_0$, $\Delta t_1$ and $\Delta t_3$ respectively correspond to the time periods $\Delta t_0$, $\Delta t_3$ shown in FIG. 10. The delay time $\Delta t_2$ corresponds to the period $\Delta t_2$ shown in FIG. 3.

In the above described structure, the timing control circuit of FIG. 11 receives signals START, MTD, $TE_1$ and $TE_0$ and outputs the precharging signal PR, a trigger clock WLT for raising the word line, the transfer signals $TG_0$ and $TG_1$ and the sense amplifier enabling signals SAE and $\overline{SAE}$. The signal START is a clock signal instructing execution of the data transfer. The signal MTD indicates the direction of data transfer. When it is at the H level, it designates data transfer from the memory cell to the data register, and when it is at the L level, it designates the transfer from the data register to the memory cell. The signals $TE_0$ and $TE_1$ are signals for controlling partial data transfer, and when they are at the H level, the transfer is carried out, and when they are at the L level, the transfer is intercepted, respectively.

The circuit of FIG. 11 is an example, and it goes without saying that the method of data transfer of FIG. 10 can be realized by other circuit structures.

As described above, in accordance with the embodiment of FIG. 10, when the data is to be transferred from the data register to the memory cell, the data register is connected to the bit line after the data of the memory cell are fully read to the bit line, and thereafter the sense amplifier is activated. Therefore, the destruction of data of the non-selected memory cell can be prevented even when partial data transfer from the data register to the memory cell is carried out.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of performing a read refresh operation and performing a partial data transfer from a data register to a memory cell array in a semiconductor memory device including a memory cell array including a plurality of word lines, a plurality of sets of bit line pairs arranged orthogonally intersecting with the word lines, and a plurality of memory cells arranged at the intersection of the word lines and the bit lines, including first memory cells undergoing data transfer and second memory cells not undergoing data transfer, a plurality of precharging circuits for precharging each of said bit line pairs, a plurality of sense amplifiers for amplifying potential difference appearing in each of said bit line pairs, a shared sense amplifier activating signal line shared by first sense amplifiers for said first memory cells and second sense amplifiers for said second memory cells;

a plurality of data registers provided for each of said bit line pairs, and a plurality of gate means responsive to a transfer signal for selectively connecting said bit line pairs to said data registers, the method comprising:

a first step of precharging said bit line pairs by said precharging circuits;

a second step of selecting first memory cells in said memory cell array for reading data stored in said first memory cells to predetermined ones of said bit line pairs connected thereto after the end of said first step, said second step including applying a signal to a predetermined one of said word lines;

a third step of preventing a signal on said shared sense amplifier activating signal line from causing a second sense amplifier to corrupt data in one of said second memory cells by selectively connecting selected ones of said bit line pairs to said data register by said gate means only after a first predetermined time period after the start of said second step; and a fourth step of applying a sense amplifier starting signal for activating both said first sense amplifiers for said first memory cells selected to undergo data transfer and said second sense amplifiers for said second memory cells not selected to undergo data transfer, at a second predetermined time period after the start of said third step, wherein said third step comprises selecting said first predetermined time period to be at least as long as a time for providing full reading of data stored in said first memory cells to said predetermined one of said bit line pairs and to be at least as long as a time for refreshing data in said second memory cells not selected to undergo data transfer and said fourth step comprising selecting said second predetermined period to be at least as long as a time required for full reading of data from the data register.

2. A method according to claim 1, wherein said memory cell array constitutes a portion of a random access memory and said data registers constitute a portion of a serial access memory.

3. A method according to claim 1, further comprising a step of transferring data from a memory cell to said data register, by performing, in sequence, the steps of:

selecting a memory cell by applying a signal to a predetermined word line thereby to read out data from a memory cell connected to said predetermined one word line to a bit line connected thereto;

amplifying the read out data in one of said sense amplifiers; and thereafter activating a transfer gate for transferring the read out data to said data register.

4. A method of performing a read refresh operation and performing a partial data transfer from a data register to a memory cell array in a semiconductor memory device including a memory cell array including a plurality of word lines, a plurality of sets of bit line pairs arranged orthogonally intersecting with the word lines, and a plurality of memory cells arranged at the intersection of the word lines and the bit line pairs, including first memory cells undergoing data transfer and second memory cells not undergoing data transfer, a plurality of precharging circuits for precharging each of said bit line pairs, a plurality of sense amplifiers for respectively amplifying potential difference appearing in each of said bit line pairs, a shared sense amplifier activating signal line shared by first sense amplifiers for said first memory cells and second sense amplifiers for said second memory cells;

a plurality of data registers provided for each of said bit line pairs, and a plurality of gate means responsive to a transfer signal for selectively connecting said bit line pairs to said data registers, said method comprising the steps of:

selecting first memory cells in said memory cell array to read data stored in the selected first memory cells to corresponding bit line pairs;

preventing a signal on said shared sense amplifier activating signal line from causing a second sense amplifier to corrupt data in one of said second memory cells by selecting a first predetermined time period to be at least as long as a time for providing full reading of data stored in the selected first memory cells to said corresponding bit line pairs and at least as long as a time for refreshing data in the non-selected second memory cells;

generating said transfer signal for selectively activating corresponding gate means to connect a selected bit line pair to said data register, said transfer signal generated said first predetermined time period following start of said step of selecting first memory cells;

selecting a second predetermined time period to be at least as long as a time required for full reading of data from the data register; and generating a second signal for starting both said first and second sense amplifiers following generation of said transfer signal by said second predetermined time period.

5. A method according to claim 4 wherein said step of generating said transfer signal comprises a step of generating first and second transfer signals, said first transfer signal provided for activating a first group of gate means connected to a corresponding first group of data registers and said first memory cells, said second transfer signal provided for activating a second group of gate means connected to a corresponding second group of data registers and said second memory cells, said first group of data registers and memory cells selected to undergo data transfer and said second group of data registers and memory cells selected not to undergo data transfer; and causing said first transfer signal to undergo a transition for activating said first group of gate means and causing said second transfer signal not to activate said second group of gate means, thereby providing substantially simultaneous activation of both said first and second sense amplifiers for said first and second memory cells while activating only said first group of gate means to avoid data destruction in said second memory cells.

6. A method according to claim 4, further comprising a step of transferring data from a memory cell to said data register, by performing, in sequence, the steps of:

selecting a memory cell by applying a signal to a predetermined word line thereby to read out data from a memory cell connected to said predetermined one word line to a bit line connected thereto;

amplifying the read out data in one of said sense amplifiers; and thereafter activating a transfer gate for transferring the read out data to said data register.

7. A method of performing a read refresh operation and performing a partial data transfer from a data register to a memory cell array in a semiconductor memory device including

- a memory cell array including a plurality of word lines, a plurality of sets of bit line pairs arranged orthogonally intersecting with the word lines, and a plurality of memory cells arranged at the intersection of the word lines and the bit lines, including first memory cells undergoing data transfer and second memory cells not undergoing data transfer,
- a plurality of precharging circuits for precharging each of said bit line pairs,
- a plurality of sense amplifiers for amplifying potential difference appearing in each of said bit line pairs,
- a shared sense amplifier activating signal line shared by first sense amplifiers for said first memory cells and second sense amplifiers for said second memory cells;
- a plurality of data registers provided for said bit line pairs, and
- a plurality of gate means responsive to a transfer signal for selectively connecting said bit line pairs to said data registers, the method comprising:

- a first step of precharging said bit line pairs by said precharging circuits;
- preventing a signal on said shared sense amplifier activating signal line from causing a second sense amplifier to corrupt data in one of said second memory cells by performing:
- a second step of selecting said second memory cells in said memory cell array to be refreshed by reading data stored therein to predetermined ones of said bit line pairs connected thereto after the end of said first step;
- a third step of selecting a first predetermined time period to be at least as long as a time for providing full reading of data stored in the selected second memory cells to said predetermined ones of said bit line pairs and selectively connecting selected ones of said bit line pairs to said data register by said gate means after said first predetermined time period after the start of said second step; and
- a fourth step of selecting a second predetermined time period to be at least as long as a time required for full reading of data from the data register and applying a common sense amplifier starting signal for activating both said first and second sense amplifiers after a second predetermined time period following the start of said third step,
- wherein said third step comprises a step of generating first and second transfer signals, a first transfer signal provided for activating a first group of gate means connected to a corresponding first group of data registers and said first memory cells selected to undergo data transfer, a second transfer signal provided for a second group of gate means connected to a corresponding second group of data registers and said second memory cells selected to be refreshed, and wherein said third step further comprises selecting said first predetermined time period to be at least as long as a time for refreshing data in said second memory cells not undergoing data transfer, and
- causing said first transfer signal to undergo a transition for activating the first group of gate means and causing the second transfer signals not to activate the second group of gate means,
- thereby providing substantially simultaneous activation of both said first and second sense amplifiers while activating only said first group of gate means to avoid data destruction in said second memory cells.

8. A method according to claim 7, further comprising a step of transferring data from a memory cell to said data register, by performing, in sequence, the steps of:

- selecting a memory cell by applying a signal to a predetermined word line thereby to read out data from a memory cell connected to said predetermined one word line to a bit line connected thereto;
- amplifying the read out data in one of said sense amplifiers; and
- thereafter activating a transfer gate for transferring the read out data to said data register.

* * * * *